United States Patent [19]
Koenig

[11] 3,995,310
[45] Nov. 30, 1976

[54] SEMICONDUCTOR ASSEMBLY INCLUDING MOUNTING PLATE WITH RECESSED PERIPHERY

[75] Inventor: Paul W. Koenig, Clyde, N.Y.

[73] Assignee: General Electric Company, Syracuse, N.Y.

[22] Filed: Dec. 23, 1974

[21] Appl. No.: 535,670

[52] U.S. Cl. .................................357/68; 357/65; 357/70; 357/75; 357/79; 357/81
[51] Int. Cl.² ................. H01L 23/48; H01L 29/44; H01L 29/52; H01L 29/60
[58] Field of Search ................. 357/65, 67, 68, 71, 357/81, 70, 79, 75

[56] References Cited
UNITED STATES PATENTS

| | | | |
|---|---|---|---|
| 3,200,310 | 8/1965 | Carman | 357/65 |
| 3,292,056 | 12/1966 | Emeis et al. | 367/65 |
| 3,303,432 | 2/1967 | Garfinkel | 357/68 |
| 3,447,118 | 5/1969 | Ferree | 357/79 |
| 3,551,758 | 12/1970 | Ferree | 357/75 |
| 3,562,592 | 2/1971 | Cooke et al. | 357/65 |
| 3,670,404 | 6/1972 | Kamoshida | 357/70 |
| 3,708,720 | 1/1973 | Whitney | 357/81 |
| 3,831,067 | 8/1974 | Wislocky et al. | 357/65 |
| 3,869,787 | 3/1975 | Umbaugh | 357/65 |

FOREIGN PATENTS OR APPLICATIONS

| | | | |
|---|---|---|---|
| 965,289 | 7/1964 | United Kingdom | 357/65 |

*Primary Examiner*—Andrew J. James
*Attorney, Agent, or Firm*—R. J. Mooney; D. E. Stoner

[57] ABSTRACT

Disclosed is an assembly with a semiconductor pellet mounting plate that defines two substantially parallel major surfaces, at least one surface having a central planar region surrounded by a smaller peripheral transition region such that the periphery of the major surface is recessed and out of the plane of the central planar region. A semiconductor pellet is mounted on the central planar region and the metallic contacts on the pellet are substantially coextensive with the central planar region. The peripheral transition region can take any of several disclosed forms.

21 Claims, 18 Drawing Figures

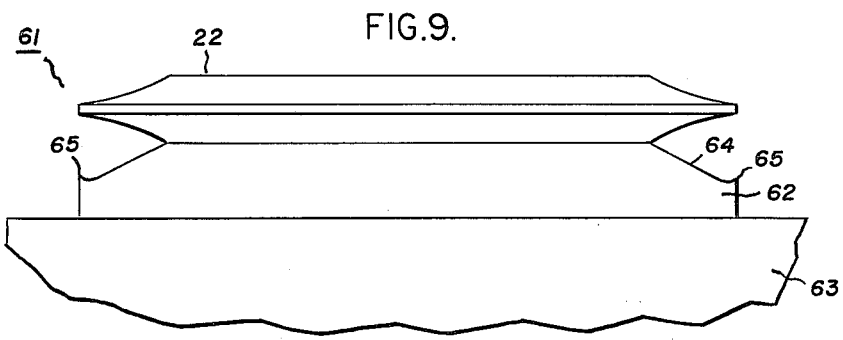
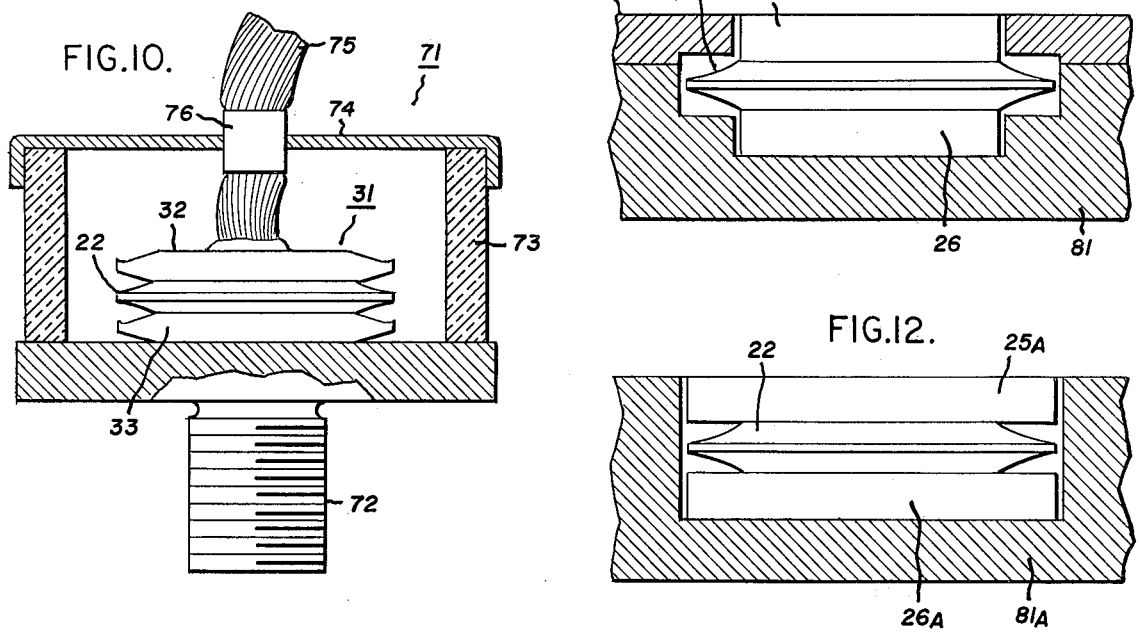
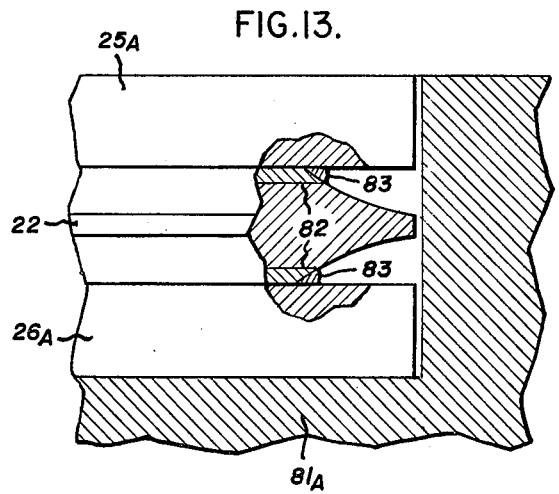

SEMICONDUCTOR ASSEMBLY INCLUDING MOUNTING PLATE WITH RECESSED PERIPHERY

BACKGROUND OF THE INVENTION

This invention relates to semiconductor devices and, more particularly, to improved apparatus for mounting semiconductor device pellets and semiconductor assemblies employing the improved apparatus.

Semiconductor pellets are usually mounted with metal plates on one or both sides, the plates serving as a stress relief mechanism, a mechanical coupling system, heat and current spreaders or mechanical protection devices or any combination of the aforementioned functions. The plates are frequently substantially coextensive with the metallic contacts on the pellet. If the plates are smaller than the contacts, there may be insufficient current spreading to adequately utilize the entire conductive area of the semiconductor pellet and, furthermore, there may be inadequate thermal coupling to the pellet to effectively remove heat therefrom. If the plates are larger than the contact, the metal plate may overlie regions of the semiconductor pellet other than the region to which it is electrically coupled. Consequently, the chance of undesirable device breakdown is enhanced and spurious, perhaps harmful, capacitances will be formed.

A problem that has developed in the use of these metal mounting plates stems from the fact that burrs are sometimes formed around the periphery thereof. The plates are generally stamped from large sheet stock and a slightly dull die or apparatus out of adjustment may cause the burrs. Typically, the burrs will occur on only one side of the plate. If the burrs are adjacent the header to which the semiconductor pellet-metal plate laminate is to be mounted, the burrs may cause a spatial separation between the face of the metal plate and the header and thus prevent full contact of the plate and the header. Consequently, thermal coupling between the header and the pellet may be inadequate. Furthermore, the mechanical strength of the coupling will be diminished. If the burr is on the side adjacent the pellet, a potentially more serious problem can occur. If the metal plate is substantially the same size as the metallic contacts on the semiconductor pellet and, as is usual, the contact terminates prior to intersection with the periphery of the pellet, the burr rests on the surface of the semiconductive pellet. If pressure is applied during the process of bonding the plate and the pellet, the inordinately high pressure occurring under the burr can cause the brittle pellet to fracture and result in device failure.

Efforts to eliminate the burrs have resulted in a cost for the metal plates that is unacceptably high for many applications.

It is an object of this invention, therefore, to provide a metal mounting plate that overcomes the aforementioned disadvantages.

SUMMARY OF THE INVENTION

This invention is characterized by a metal mounting plate for semiconductor pellets, the plate defining two substantially parallel major surfaces, each with an interior planar region. A first one of the major surfaces is adapted to receive a semiconductor pellet and defines a peripheral transition region such that at least a portion of the peripheral corner of the first major surface is recessed from and out of the plane of the interior planar region. Depending upon the manufacturing steps chosen when making the plates, it may be necessary for the peripheral transition region to extend around the entire periphery, thus placing the entire peripheral edge out of the plane of the central planar region. The stamping is performed such that any burrs appear on the first major surface and the recess is chosen to be large enough that any burrs formed are without the plane of the interior planar region. Consequently, the aforementioned difficulties are overcome inasmuch as the burrs cannot contact either the pellet or the header to which the structure is to be mounted. Furthermore, punch life can be extended inasmuch as a certain amount of burring can be tolerated in the improved plate.

The number of edges of the plate possessing transition regions is determined by the punching steps necessary. For example, if a strip of metal material with no burring on the edges thereof is to be cut into metal plates, only the two edges of the plates that are to be cut need have the transition regions. However, if sheet stock is to be punched, it is desirable to provide transition regions on all four sides of the plate.

The subject improved metal plate is amenable to solder cladding on either or both major surfaces. Utilizing a solder-clad plate substantially simplifies the process of mounting the pellet to the plate and mounting the plate to the header for several reasons. For example, the number of parts is substantially reduced as compared to a mounting system utilizing separate solder preforms. For a more complete discussion of the advantages of utilizing solder-clad plates, refer to my copending U.S. Pat. No. 3,919,709, entitled, Metallic Plate-Semiconductor Assembly And Method For The Manufacture Thereof, and assigned to the assignee of the present application.

Preferably, the metal plates, due to the presence of the peripheral transition region, are as large or larger than the semiconductor pellet. Thus, the periphery of each metal plate extends at least as far as or farther than the periphery of the semiconductor pellet and provides protection therefor during processing or handling. Consequently, the subject mounting plate is extremely advantageous for use on semiconductor pellets that are to be sold as unpackaged semiconductor pellets.

DESCRIPTION OF THE DRAWINGS

These and other features and objects of the present invention will become more apparent upon a perusal of the following description taken in conjunction with the accompanying drawings wherein:

FIG. 9 illustrates a semiconductor assembly with yet another alternate improved mounting plate;

FIG. 10 illustrates the improved semiconductor assembly of FIG. 2 installed in a stud mounted package of conventional design;

FIG. 11 is an elevation view diagrammatically showing the prior art semiconductor assembly of FIG. 1 during manufacture;

FIG. 12 illustrates a corresponding manufacturing step utilized in fabricating an alternate prior art semiconductor assembly;

FIG. 13 is a detail view of a portion of FIG. 12 illustrating a problem encountered when manufacturing the prior art assembly illustrated in FIG. 12;

DESCRIPTION OF THE PREFERRED EMBODIMENTS

Figure 1:
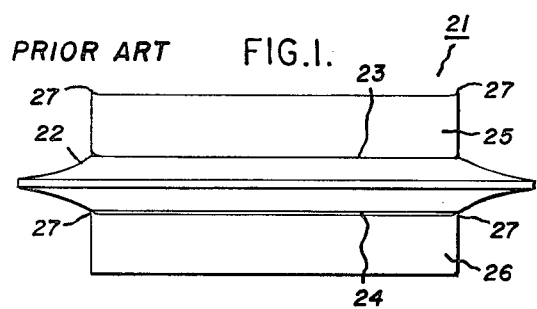
FIG. 1 is an elevation view of a prior art semiconductor assembly.

Referring first to FIG. 1, there is illustrated a prior art semiconductor assembly 21 including a semiconductor pellet 22 defining two substantially parallel major surfaces 23 and 24. The pellet 22 contains a preselected distribution of conductivity altering dopants such that a semiconductor device pellet 22 is formed. In general, the surfaces 23 and 24 support metallic contacts to facilitate establishing electrical coupling to the various conductivity altered regions of the pellet 22. The metallic contacts on the surface of the pellet 22 are conventional and are not shown in FIG. 1 nor in most subsequent Figures in order to preserve clarity.

The pellet can comprise any semiconductive device such as, for example, a diode, an SCR, a triac, etc., and can be fabricated using any conventional techniques, such as glassivation, if desired. The pellet 22, as illustrated in FIG. 1, was grooved from each side prior to subdivision from a parent wafer. Thus, the double bevel at the periphery is formed. Such a method of subdividing pellets is old in the art.

Coupled to each of the major surfaces 23 and 24 is a metal plate 25 and 26, respectively. The coupling between the plates and the pellet provides electrical, mechanical, and thermal contact. Commonly, the coupling is provided by soldering the plates to the metallic contacts on the surface of the pellet.

Illustrated on each plate 25 and 26 are two burrs 27 that are formed when the plates are punched from larger stock as described above. It is these burrs that create the difficulties previously described with respect to the prior art.

Figure 2:
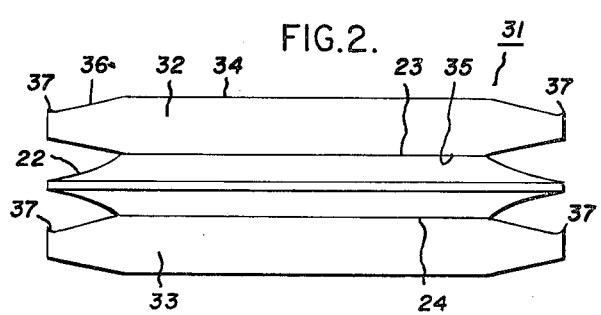
FIG. 2 is an elevation view of an improved assembly generally similar to that shown in FIG. 1.

Referring now to FIG. 2, there is shown an improved assembly 31 including the pellet 22. Mounted to the upper and lower surfaces 23 and 24 of the pellet are improved metal mounting plates 32 and 33. Two coupling systems, such as solder bonded to metallic contacts on the pellet 22, can be used to couple the pellet 22 and the plates 32 and 33.

The plates 32 and 33 are identical insofar as possible. For example, if the pellet 22 is a diode pellet, the plates can be identical. However, if it is assumed, for example, that the pellet 22 is an SCR pellet, the plate on the major surface with the SCR gate contact will have the portion overlying the gate contact removed. For example, the plate may have a corner punched out or an aperture put in the center. However, such modifications are minor and are not deemed inventive. Consequently, the plates 32 and 33, and the plates illustrated in subsequent FIGS. shall be treated as square plates, it being within the ability of those skilled in the art to change the shape as necessary.

Considering the plate 32 as typical, it will be appreciated that it defines two substantially parallel major surfaces 34 and 35, each surface defining an interior planar region bounded by a peripheral transition region 36. The peripheral transition regions render the peripheral corners of the metal plate recessed from and without the planes of the central planar regions. At least one of the central planar regions is adapted to receive the semiconductor pellet 22. The properties required to render the surface able to receive the pellet are well known to those skilled in the art and include such considerations as surface smoothness and bondability.

In FIG. 2, it will be observed that a burr 37 is on one peripheral corner. However, due to the peripheral transition region, the burr also is without the plane of the interior planar region. Consequently, the aforementioned problems that can occur due to the presence of the burr are alleviated. Preferably, the peripheral transition region 36 is small as compared to the interior planar regions to maximize the ratio of the area of the planar region to the entire plate area, thus providing efficient utilization of the plate area.

Figure 3:
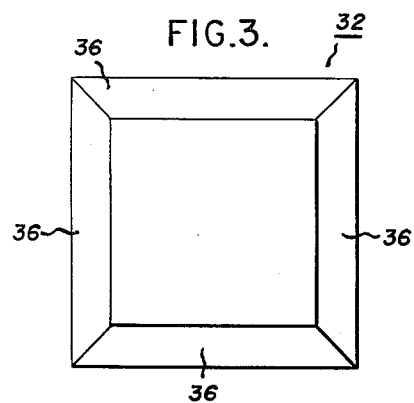
FIG. 3 is a plan view of an improved metal mounting plate utilized in the assembly illustrated in FIG. 2.

Referring now to FIG. 3, there is a plan view of the plate 32. Observation of FIG. 3 shows that the plate and the interior planar region are both square, and, furthermore, that the peripheral transition regions are formed on all sides of the square and thus the interior planar region is a central planar region. It is not necessary to form transition regions on all four sides of the plate to provide a plate with improved properties. However, it is felt that, inasmuch as some trimming of the plate on all four sides is necessary, freedom from burrs is maximized if the transition regions are formed on all sides. It should be realized that the square plate is shown as an example, and the plate could be other shapes, such as round or hexagonal.

The solder used to bond the semiconductor pellet 22 to the metal plate and the metal plate to a header (or other substrate) can consist of discrete preforms put in place and heated as is conventional in the prior art. Alternately and preferably one or both of the surfaces of the metal plate 32 can be solder clad. Solder cladding is advantageous inasmuch as it reduces the number of parts required for the assembly, prevents excessive solder buildup, and eliminates certain fixturing problems. The advantages of solder clad plates clearly pointed out in my aforementioned U.S. Pat. entitled Metallic Plate Semiconductor Assembly And Method For The Manufacture Thereof.

The choice of material for the metal plate 32 is well within the ability of those skilled in the art. Considerations involved in the choice are enumerated in my aforementioned copending application.

Figure 4:
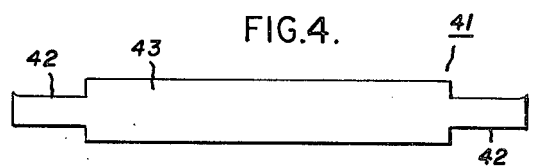
FIGS. 4 and 5 illustrate alternate improved mounting plates.
Figure 5:
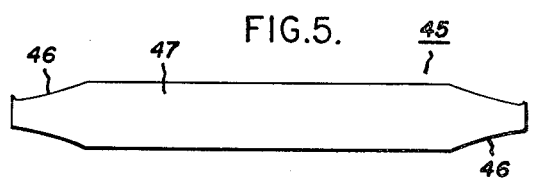

The plate 32 as illustrated in FIGS. 2 and 3 included a straight beveled peripheral transition region. Referring now to FIGS. 4 and 5, alternate embodiments are shown. A plate 41 is illustrated in FIG. 4 and includes a step transition region 42 defining an innterior planar region 43. It will be appreciated that functionally the plate 41 is similar to the plate 32.

Referring now to FIG. 5, there is illustrated a plate 45 with an arcuate transition region 46 defining an interior planar region 47.

Observation of FIGS. 4 and 5 makes plain that the plates 41 and 45 are used in the same manner as the plates 32 and 33 and provide the same advantages. All are considered excellent devices and the choice among them can be made primarily on the basis of which is easiest to manufacture with available tooling.

Figure 6:
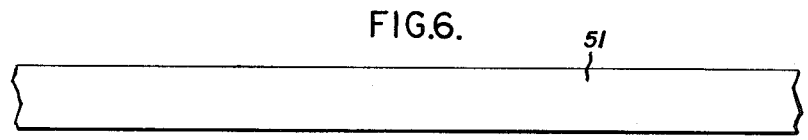
FIGS. 6, 7, and 8 diagrammatically illustrate steps involved in manufacturing the improved semiconductor pellet mounting plates.
Figure 7:
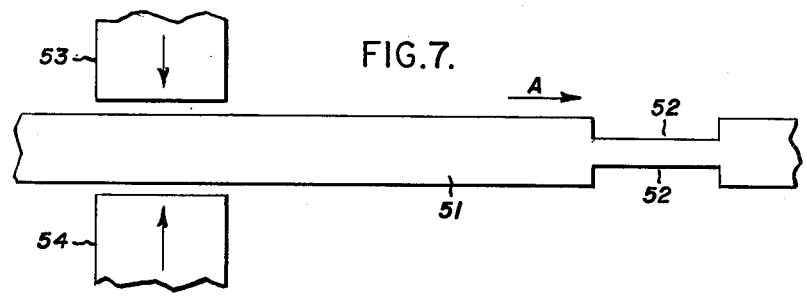
Figure 8:
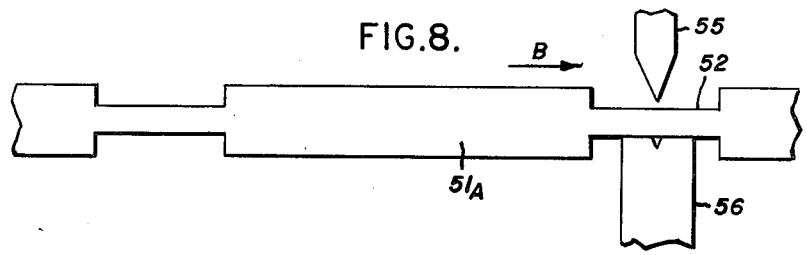

Referring now to FIGS. 6, 7, and 8, there is diagrammatically illustrated one method of fabricating the plate 41. Starting with a strip 51 of the chosen metal, as illustrated in FIG. 6, a series of transverse grooves 52 (only one of which is shown) is formed as illustrated in FIG. 7. As shown in FIG. 7, the strip 51 is advanced in steps in the direction of the arrow A and, between steps, two die 53 and 54, move in the direction indicated to form the double-sided grooves 52. Following the forming operation, the formed strip 51A is stepped in the direction of the arrow B, as illustrated in FIG. 8, between a die 55 and a platen 56. Between steps, the die 55 and the platen 56 come together shearing thhe strip 51A in the center of the grooves 52. Consequently, the strip 51A is separated into a plurality of the pellets 41. The cutting operation of the die and platen puts the burr around the periphery of the pellet. The size of the burr will vary and depends upon the sharpness of the die, the general condition of the equipment, the metal chosen for the plate, etc. However, it will be appreicated that when utilizing the subject metal mounting plate, a larger burr can be accommodated than otherwise would be possible. Thus, one benefit derived from the use of the subject plate is that the die 55 can be used longer inasmuch as a larger burr can be tolerated.

It should be appreciated that the steps illustrated in FIGS. 6, 7, and 8 are diagrammatic in nature. The techniques utilize to step the strip and drive the dies are conventional and, thus, need not be illustrated here. Further, the shape of the dies 53 and 54 will determine whether the plate to be formed takes the profile of the plate 32, 41, or 45.

Additionally, it should be realized that the steps illustrated in FIGS. 6, 7, and 8 are employed when strip material possessing edges that are relatively burr-free is being utilized.

If sheet material is being utilized, a first step may be to cut the sheets into strips. If that cutting operation generates burrs, it may be desired to pass rollers over the cutting prior to cutting such that the peripheral transition regions are placed along the region where cuts are to be made. In that event the pellet 32, as illustrated in FIG. 3, with four peripheral transition regions 36 is fabricated. Or, rolling after cutting will remove the burrs from the sides of the strip.

Again, it should be stressed that the choice of methods for making any of the plates 32, 41, or 45 is well within the ability of those skilled in the art whether the plate is to have two or four peripheral transition regions.

Referring now to FIG. 9, there is illustrated an assembly 61 including the semiconductor pellet 22 coupled to a metal mounting plate 62 which is attached to a substrate, such as a header 63.

What is significant about the embodiment 61 is that the plate 62 includes a peripheral transition region 64 on only one side thereof. Manufacturing processes for the plate 62 are similar to those illustrated in FIGS. 6, 7, and 8 except that the dies used to form the grooves along the cutting line form a groove on only one side. Also, care should be taken to insure the cutting is performed in such a way that the burr 65 occurs on the side with the peripheral transition region. It will be appreciated that the second side of the plate 62 is planar and thus contains an interior or central planar region that, in fact, spans the entire surface thereof.

For certain applications the plate 62 may be preferable to any of the plates 32, 41, or 45. However, a difficulty may be encountered inasmuch as the plate 62 must be properly oriented if it is decided that the side with the peripheral transition region 64 is to be adjacent the semiconductor pellet 22.

As illustrated in FIG. 9, the peripheral transition region is a straight level. However, it should be appreciated that the arcuate and step configurations are also useful when placed on only one side of the plate 62.

Referring now to FIG. 10, there is illustrated a semiconductor apparatus 71 including a studded header 72 with an annular insulative sleeve 73 hermetically sealed thereto. A cap 74 is sealed to the top of the sleeve 73 thus completing the housing. Coupled to the surface of the header 72 is an assembly 31 as illustrated in FIG. 2. The coupling between the header and the assembly 31 can be, for example, solder and provides electrical, mechanical and thermal coupling. It will be appreciated, of course, that the assembly 31 can include any of the various embodiments of mounting plates previously described. A lead 75 passes through a sleeve 76 in the cap 74 and is soldered to the upper plate 32. Thus FIG. 10 diagrammatically illustrates a semiconductive device in a conventional stud housing, showing how the assembly 31 is incorporated therein. The apparatus 71 is illustrated as being a two-leaded device, such as a diode. It will be appreciated that the device 71 can be any other semiconductive device such as a thyristor. If the device were a thyristor, a gate lead would be attached to the pellet 22 by conventional means.

Referring now to FIG. 11, there is shown a prior art semiconductive assembly as illustrated in FIG. 1 being fabricated. A lower frame portion 81 first receives the lower mounting plate 26, then receives the semiconductive pellet 22. Next, an upper frame 82 must be put in place prior to the installation of the upper plate 25. The second frame is necessitated since the plates 25 and 26 are substantially smaller than the pellet 22.

An alternative arrangement that would obviate the need for the upper frame 22 is illustrated in FIG. 12. A portion of a lower frame 81A is shown that receives a lower plate 26A that is substantially the same size as the semiconductor pellet 22. An upper plate 25A is also substantially the same size as the semiconductor pellet and thus no upper frame is needed as will be appreciated from observation of FIG. 12.

A detailed view of the frame 81A is shown in FIG. 13. The pellet 22 is illustrated as having two PN junctions 82 near the upper and lower surfaces thereof. When the plates and the pellet (and solder preforms, if clad plates are not used) are in the juxtaposition illustrated in FIG. 12, heat is applied to form solder bond therebetween. Some pressure is generally applied to insure good contact and an improved solder bond. That pressure will force a small amount of solder out around the periphery of the pellet and form solder beads 83 as illustated most clearly in FIG. 13. It will be appreciated that those beads may overlap the junctions 82 and, despite the presence of some passivant, short or substantially degrade the junctions, thus rendering the pellet 22 inoperative. Thus, it is apparent why the prior art generally utilizes smaller mounting plates as illustrated in FIG. 1.

Figure 14:
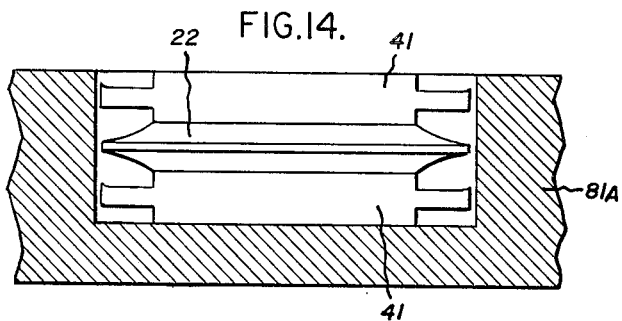
FIG. 14 illustrates a corresponding manufacturing step involved when manufacturing the improved semiconductor assembly illustrated in FIG. 2.

The subject mounting plates overcome the solder bead problem. Referring first to FIG. 14, there is illustrated the frame 81A with the semiconductor pellet 22 therein. However, as illustrated in FIG. 14 the plates 25A and 26A have been replaced with the plates 41. It will be appreciated that the plates 41 are substantially the same size or slightly larger than the pellet 22.

Figure 15:
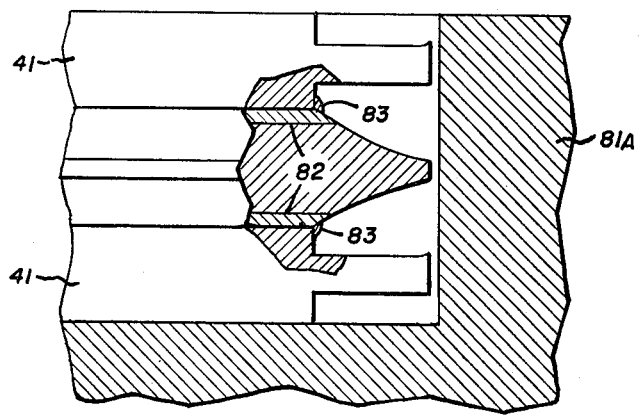
FIG. 15 is a detail view of a portion of FIG. 14 illustrating how the improved semiconductor assembly overcomes the problem illustrated in FIG. 13.

A detailed view of FIG. 14 is shown in FIG. 15. There, it is shown that the vertical step of the peripheral transition region of the plates 41 avoids the creation of a narrow crevice. It was this narrow crevice that was illustrated in FIG. 13 that caused the beads to traverse so far on the surface of the pellet. The more planar surface that the solder beads 83 see in the configuration shown in FIGS. 14 and 15 causes the beads to remain nearer to the pellet-plate interface. Thus, as illustrated in FIG. 15 the beads do not approach the junction 82 and junction shorting and resultant device failure is less of a problem.

It will be appreciated that all of the improved mounting plates, in conjunction with a semiconductor pellet, will form an outwardly opening annular recess that will retain surplus solder.

Figure 16:
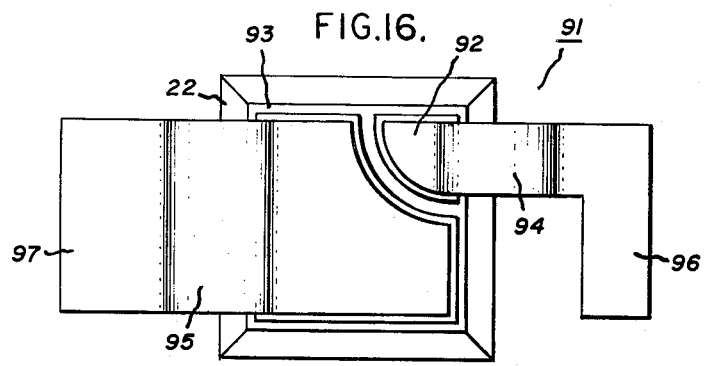
FIGS. 16 and 17 illustrate still another embodiment of the invention.
Figure 17:
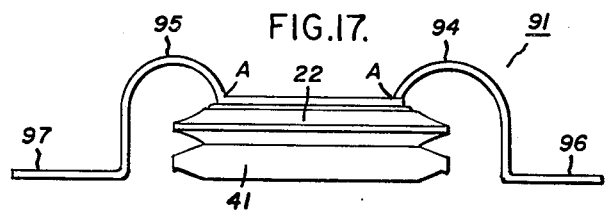

Referring now to FIGS. 16 and 17, there is illustrated an assembly 91 including the pellet 22 and a lower mounting plate 41. Assume that the pellet 22 is an SCR with a corner gate. Shown in FIG. 16 is a metallic gate contact 92 and a cathode contact 93. Soldered, or otherwise fastened to the gate contact, is a ribbon shaped gate lead 94. Similarly, soldered or otherwise fastened to the cathode contact 93 is another ribbon lead 95. By ribbon shaped, it is meant that the leads 94 and 95 are substantially wider than they are high and thus are shaped more like ribbons than conventional wire leads.

As illustrated best in FIG. 17, the ribbon shaped leads 94 and 95 are upturned at the points A so that the leads and the peripheral corner of the major face of the pellet 22 to which they are attached remain spatially separated. Thus, the problem of solder collecting and flowing down the pellet (which was illustrated in FIG. 13) is avoided. It will also be appreciated from an observation of FIGS. 16 and 17 that each lead has a terminal planar portion 96 and 97. Each terminal planar portion 96 and 97 is in the plane of the central planar region of the lower major surface of the plate 41. Thus, all three contacts are accessible in one plane and the assembly 91 can be placed on a properly patterned substrate such as a printed circuit board and quickly fastened in place.

The assembly 91 can be further improved if the surface of the leads 94 and 95 that is adjacent the pellet is solder clad. With the leads solder clad, the leads need only be placed in position on the pellet as illustrated in FIGS. 16 and 17 and heated in order to bond the lead to the pellet. Furthermore, if the lower surface of the plate 41 is solder clad also, the assembly 91 can simply be placed on a substrate such as a printed circuit board and the entire assembly heated to quickly and easily electrically, mechanically and thermally bond the assembly 91 to the substrate. Thus, assembly 91 is well suited for device pellet sales.

Figure 18:
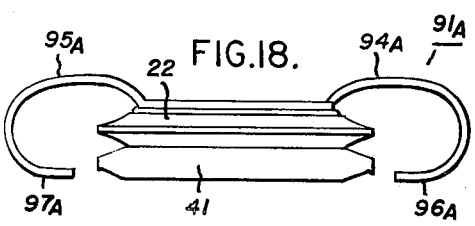
FIG. 18 shows a modification of the device shown in FIGS. 16 and 17.

Referring now to FIG. 18, there is shown an alternate assembly 91A including two leads 94A and 95A that are similar to the leads 94 and 95 except that the lower planar regions 96A and 97A are turned inward rather than outward as was illustrated in FIG. 17. A similar upturn occurs in the leads at a corresponding point in the embodiment 91A.

The choice between the embodiments 91 and 91A is based on several considerations. For example, it will be appreciated that thhe overall length of the embodiment 91A is shorter. However, the embodiment 91A can be more difficult to manufacture inasmuch as both sides of the ribbon leads 94A and 95A must be solder clad to obtain the benefits described above with respect to solder cladding only one side of the leads 94 and 95. Furthermore, the terminal planar regions 96A and 97A may have to be smaller than the counterparts in the embodiment 91.

It will be appreciated that many alternatives are possible when practicing the subject invention. For example, the pellet may or may not be glassed and can be any pellet for any semiconductive device such as a diode, transistor, SCR, triac, etc. Further, any of the metal plates can contain the bevel, arcuate, or step transition regions on one or both sides and can be solder clad on one or both sides or not clad at all.

In view of the foregoing, many modifications and variations of the present invention will be apparent to those skilled in the art. Consequently, it is desired that the scope of the invention be limited only by the following claims.

I claim:

1. A mounting plate for mounting a semiconductor device pellet, said plate defining two substantially parallel major surfaces, each of said major surfaces defining an interior planar region and wherein at least a first one of said major surfaces is adapted to receive a semiconductor pellet and defines a peripheral transition region such that at least a portion of the peripheral corner of said first major surface is recessed from and without the plane of the interior planar region thereof, said portion of the peripheral corner having a burr projecting in the direction of the plane of said interior planar region of said first major suface, said burr being entirely without the plane of the interior planar region of said first major surface.

2. A mounting plate for mounting a semiconductor device pellet, said plate defining two substantially parallel major surfaces, each of said major surfaces defining a central planar region and wherein at least a first one of said major surfaces is adapted to receive a semiconductor pellet and defines a peripheral transition region such that the peripheral corner of said first major surface is recessed from and without the plane of the central planar region thereof and said transition region is smaller than said central planar region, said peripheral corner having a burr projecting in the direction of the plane of said central planar region of said first major surface, said burr being entirely without the plane of the central planar region of said first major surface.

3. A mounting plate according to claim 2 wherein said first major surface is solder clad.

4. A mounting plate according to claim 3 wherein said major surface other than said first major surface is solder clad.

5. A mounting plate according to claim 2 wherein the major surface other than said first major surface defines a peripheral transition region such that the peripheral corner of said other major surface is without the plane of the central planar region thereof.

6. A mounting plate according to claim 5 wherein both of major surfaces are solder clad.

7. A semiconductor apparatus comprising:
a semiconductor body defining first and second substantially parallel faces, said body containing a preselected distribution of conductivity altering impurities such that a semiconductive device pellet is formed, and wherein each of said faces has at least one metallic contact thereon in an electrically conductive relationship with said pellet;
a metallic mounting plate defining first and second substantially parallel major surfaces, each of said major surfaces defining a central planar region and wherein at least said first major surface defines a peripheral transition region such that the peripheral corner of said first major surface is without the plane of the central planar region thereof, said peripheral corner having a burr projecting toward the plane of said central planar region of said first major surface, said burr being entirely without the plane of said central planar region of said first major surface, and wherein the central planar region of said first major surface and a metallic contact on said first face are in a face-to-face juxtaposition and are substantially coextensive; and
bonding means for electrically and mechanically uniting said semiconductor body and said mounting plate.

8. Apparatus according to claim 7 wherein said bonding means comprises solder.

9. Apparatus according to claim 7 wherein the outer periphery of said semiconductor body is not larger than the outer periphery of said mounting plate.

10. Apparatus according to claim 7 comprising a second mounting plate similar to said mounting plate, said second mounting plate being bonded to said second face of said semiconductor body.

11. An apparatus according to claim 7 wherein said peripheral transition region comprises a beveled region.

12. Apparatus according to claim 7 wherein said peripheral transition region comprises an arcuate region.

13. Apparatus according to claim 7 wherein said peripheral transition region comprises a step.

14. Apparatus according to claim 7 wherein said mounting plate is copper.

15. Apparatus according to claim 7 wherein said mounting plate is molybdenum.

16. Apparatus according to claim 7 further comprising at least one ribbon shaped lead bonded to a metallic contact on said second face, a portion of said lead projecting beyond the periphery of said body.

17. Apparatus according to claim 16 wherein said lead is bonded to said contact by solder.

18. Apparatus according to claim 17 wherein said ribbon shaped lead is upturned such that said lead and the periphery of said pellet are spacially separated.

19. Apparatus according to claim 16 wherein the portion of said lead that projects beyond the periphery terminates with a planar portion in the plane of the central planar region of said second major surface.

20. Apparatus according to claim 19 wherein at least the surface of said lead that is adjacent to said metallic contact or said second face is solder clad.

21. Apparatus according to claim 20 wherein said ribbon shaped lead is upturned such that said lead and the periphery of said pellet are spacially separated.

* * * * *